United States Patent
Iwashita et al.

(10) Patent No.: US 7,596,840 B2
(45) Date of Patent: Oct. 6, 2009

(54) METHOD FOR MANUFACTURING PIEZOELECTRIC THIN FILM RESONATOR

(75) Inventors: Setsuya Iwashita, Yamanashi (JP); Takamitsu Higuchi, Nagano (JP)

(73) Assignee: Seiko Epson Corporation (JP)

( * ) Notice: Subject to any disclaimer, the term of this patent is extended or adjusted under 35 U.S.C. 154(b) by 408 days.

(21) Appl. No.: 11/190,038

(22) Filed: Jul. 26, 2005

(65) Prior Publication Data
US 2006/0037183 A1    Feb. 23, 2006

(30) Foreign Application Priority Data
Aug. 23, 2004  (JP)  ............... 2004-242328

(51) Int. Cl.
*H04R 17/10*   (2006.01)
*B44C 1/165*   (2006.01)

(52) U.S. Cl. .............. 29/25.35; 29/847; 29/831; 156/230; 156/233; 310/312; 310/321; 310/365

(58) Field of Classification Search ............... 29/25.35, 29/594, 846, 847, 831; 156/230, 233, 236, 156/247; 148/33, 33.4; 310/312, 321, 365; 73/763; 438/455
See application file for complete search history.

(56) References Cited

U.S. PATENT DOCUMENTS

| | | | | |
|---|---|---|---|---|
| 6,045,626 A | * | 4/2000 | Yano et al. | ............... 148/33.4 |
| 6,182,340 B1 | * | 2/2001 | Bishop | ............... 29/25.35 |
| 6,666,943 B2 | * | 12/2003 | Wada et al. | ............... 156/230 |
| 6,911,107 B2 | | 6/2005 | Kagawa et al. | |
| 7,118,990 B1 | * | 10/2006 | Xu et al. | ............... 438/455 |
| 2004/0163478 A1 | * | 8/2004 | Xu et al. | ............... 73/763 |
| 2005/0255234 A1 | | 11/2005 | Kanda et al. | |

FOREIGN PATENT DOCUMENTS

| | | | | | |
|---|---|---|---|---|---|
| JP | 55100723 A | * | 7/1980 | | ............... 310/321 |
| JP | 07-169661 | | 7/1995 | | |
| JP | 2001-196892 | | 7/2001 | | |
| JP | 2002-134806 | | 5/2002 | | |
| JP | 2002-305334 | | 10/2002 | | |
| JP | 2003-158309 | | 5/2003 | | |
| JP | 2004-072715 | | 3/2004 | | |
| JP | 2005-311912 | | 11/2005 | | |

* cited by examiner

*Primary Examiner*—A. Dexter Tugbang
(74) *Attorney, Agent, or Firm*—Harness, Dickey & Pierce, P.L.C.

(57) ABSTRACT

To provide a method for manufacturing a piezoelectric thin film resonator with excellent characteristics. A method for manufacturing a piezoelectric thin film resonator in accordance with the present invention includes a step of forming a laminated body by successively laminating, above a first substrate, a piezoelectric thin film and a first electrode, a step of bonding a second substrate and the laminated body, a step of separating the first substrate from the laminated body, a step of forming a second electrode above the piezoelectric thin film, and a step of patterning the second electrode, the piezoelectric thin film and the first electrode.

2 Claims, 6 Drawing Sheets

METHOD FOR MANUFACTURING PIEZOELECTRIC THIN FILM RESONATOR

RELATED APPLICATIONS

This application claims priority to Japanese Patent Application No. 2004-242328 filed Aug. 23, 2004 which is hereby expressly incorporated by reference herein in its entirety.

BACKGROUND

1. Technical Field

The present invention relates to methods for manufacturing piezoelectric thin film resonators, piezoelectric thin film resonators, frequency filters, methods for manufacturing oscillators, oscillators, electronic circuits, and electronic apparatuses.

2. Related Art

For communications at higher speeds and in greater capacities, electronic components, such as, resonators, oscillators, filters and the like that can be used at higher frequencies and in broader bands are desired. Resonators, oscillators and filters which use surface acoustic wave (SAW) are known as such electronic components. However, in SAW devices, the electrode width of comb-teeth electrodes needs to be miniaturized, such that problems may arise in the manufacturer of thin lines, dielectric breakdown strength of electrodes and the like. In this respect, piezoelectric thin film resonators that use piezoelectric thin films are attracting attention.

Piezoelectric thin film resonators may readily be made for operations at a high frequency because their frequency can be controlled by the film thickness of piezoelectric thin films and therefore their electrodes do not need to be formed into minute patterns. Because their electrodes do not have to be miniaturized, the electrodes have greater dielectric breakdown strength. Also, although piezoelectric thin film resonators use bulk acoustic waves, they generally have an electromagnetic coupling coefficient greater than that of SAW devices using surface acoustic waves, such that they are advantageous in broadening the band.

It is an object of the present invention to provide a method for manufacturing piezoelectric thin film resonators having excellent characteristics, and piezoelectric thin film resonators obtained by the manufacturing method. Also, it is another object of the present invention to provide frequency filters having the piezoelectric thin film resonators. Further, it is another object of the present invention to provide a method for manufacturing oscillators having excellent characteristics, and oscillators obtained by the manufacturing method. Also, it is another object of the present invention to provide electronic circuits having at least one of the frequency filter and the oscillator, and electronic apparatuses having the electronic circuit.

SUMMARY

A method for manufacturing a piezoelectric thin film resonator in accordance with the present invention includes: a step of forming a laminated body by successively laminating, above a first substrate, a piezoelectric thin film and a first electrode; a step of bonding a second substrate and the laminated body; a step of separating the first substrate from the laminated body; a step of forming a second electrode above the piezoelectric thin film; and a step of patterning the second electrode, the piezoelectric thin film and the first electrode.

In the present invention, the case in which a specific object (hereafter referred to as "B") is formed above another specific object (hereafter referred to as "A") includes a case in which B is formed directly on A, and a case in which B is formed over A through another object on A. Also, in the present invention, B formed above A includes B formed directly on A, and B formed above A through another object on A.

According to the method for manufacturing a piezoelectric thin film resonator, the piezoelectric thin film can be formed above the first substrate, such that the piezoelectric thin film composed of a high quality epitaxial film can be readily formed. Further, according to this manufacturing method, even when semiconductor elements are formed in advance on the second substrate, the semiconductor elements are not affected by the film-forming temperature of the piezoelectric thin film. Accordingly, the piezoelectric thin film resonator having the piezoelectric thin film with excellent crystallinity and the semiconductor elements with excellent characteristics can be readily integrated.

In the method for manufacturing a piezoelectric thin film resonator in accordance with the present invention, the step of bonding the second substrate and the laminated body may be conducted such that the first substrate becomes to be above the second substrate.

The method for manufacturing a piezoelectric thin film resonator in accordance with the present invention may include a step of patterning the second substrate.

In the method for manufacturing a piezoelectric thin film resonator in accordance with the present invention, the step of forming the laminated body may include a step of forming a buffer layer above the first substrate, before forming the piezoelectric thin film, the step of bonding the second substrate and the laminated body may be conducted through bonding the first electrode and the second substrate through an adhesion layer, and the step of separating the first substrate may be conducted through etching the buffer layer.

In the method for manufacturing a piezoelectric thin film resonator in accordance with the present invention, the step of forming the laminated body may include a step of further laminating a protection layer above the first electrode to thereby form the laminated body.

In the method for manufacturing a piezoelectric thin film resonator in accordance with the present invention, the step of forming the laminated body may include a step of forming a buffer layer above the first substrate before forming the piezoelectric thin film, the step of bonding the second substrate and the laminated body may be conducted through bonding the protection layer and the second substrate through an adhesion layer, and the step of separating the first substrate may be conducted through etching the buffer layer.

In the method for manufacturing a piezoelectric thin film resonator in accordance with the present invention, the protective layer may consist of at least one kind among $SiO_2$, $ZrO_2$, $Al_2O_3$ and $Ta_2O_5$.

In the method for manufacturing a piezoelectric thin film resonator in accordance with the present invention, the buffer layer may consist of at least one kind among metal oxides MO (M=Mg, Ca, Sr, Ba) with a NaCl structure and ZnO.

The method for manufacturing a piezoelectric thin film resonator in accordance with the present invention may include a step of patterning the adhesion layer after the step of patterning the second substrate.

In the method for manufacturing a piezoelectric thin film resonator in accordance with the present invention, the piezoelectric thin film may consist of one material among $KNbO_3$, $LiNbO_3$ and $LiTaO_3$, or a compound having the material as a main component.

In the method for manufacturing a piezoelectric thin film resonator in accordance with the present invention, the second substrate may be a Si substrate or a Si substrate with a semiconductor element formed therein.

A piezoelectric thin film resonator in accordance with the present invention may be obtained by the method for manufacturing a piezoelectric thin film resonator described above.

A frequency filter in accordance with the present invention may include the piezoelectric thin film resonator described above.

A method for manufacturing an oscillator in accordance with the present invention pertains to a method for manufacturing an oscillator having a piezoelectric thin film resonator, and includes: a step of forming a laminated body by successively laminating, above a first substrate, a piezoelectric thin film and a first electrode; a step of forming an oscillation circuit having a transistor on a second substrate; a step of bonding the second substrate and the laminated body, in a region other than an area to form the oscillation circuit, so that the first substrate is above the second substrate; a step of separating the first substrate from the laminated body; a step of forming a second electrode above the piezoelectric thin film; and a step of patterning the second electrode, the piezoelectric thin film and the first electrode.

According to the method for manufacturing an oscillator, the piezoelectric thin film can be formed above the first substrate, such that the piezoelectric thin film composed of a high quality epitaxial film can be readily formed. Further, according to this manufacturing method, even when the oscillation circuit is formed in advance on the second substrate, the oscillation circuit is not affected by the film-forming temperature of the piezoelectric thin film. Accordingly, the piezoelectric thin film resonator having the piezoelectric thin film with excellent crystallinity and the oscillation circuit with excellent characteristics can be readily integrated. As a result, the oscillation circuit can be obtained with excellent characteristics.

In the method for manufacturing an oscillator in accordance with the present invention, the step of forming the oscillation circuit may be conducted before the step of bonding the second substrate and the laminated body.

An oscillator in accordance with the present invention may be obtained by the method for manufacturing an oscillator described above.

An electronic circuit in accordance with the present invention may include at least one of the frequency filter described above and the oscillator described above.

An electronic apparatus in accordance with the present invention may include the electronic circuit described above.

DETAILED DESCRIPTION

Figure 1:
FIG. 1 is a cross-sectional view schematically showing a method for manufacturing a piezoelectric thin film resonator in accordance with an embodiment.

Preferred embodiments of the present invention are described below with reference to the accompanying drawings. It is noted that each of the drawings is a schematic drawing, and members may be shown in different reduced scales so that each of the members has a size recognizable in the drawings.

1-1. Method for Manufacturing Piezoelectric Thin Film Resonator

An example of a method for manufacturing a piezoelectric thin film resonator 100 in accordance with an embodiment of the present invention is described with reference to FIG. 1-FIG. 10. FIG. 1-FIG. 10 are cross-sectional views schematically showing a process of manufacturing the piezoelectric thin film resonator 100.

(1) First, as shown in FIG. 1, a single-crystal sapphire substrate with an orientation (0001) is prepared as a first substrate 1. Next, a buffer layer 2 is formed on the first substrate 1. As the buffer layer 2, for example, ZnO or the like may be used. The method for forming the buffer layer 2 is not particularly limited, and a known film forming method, such as, for example, a sputter method, a vapor deposition method or the like can be used. A laser ablation method, which is one type of a vapor deposition method, is used in the present embodiment. Concrete conditions of the film formation are as follows.

As a target in the laser ablation method, for example, ZnO ceramics may be used. The film-forming temperature (substrate temperature) is, for example, 400° C. The degree of vacuum during the film-formation is, for example, 1.33 Pa ($1\times10^{-2}$ Torr) or less. It is noted that the film forming conditions are not limited to the conditions described above.

By forming ZnO in a film as the buffer layer 2 under the conditions described above, for example, ZnO epitaxially grows with a (0001) orientation on the single-crystal sapphire with a (0001) orientation, and can become to be an excellent crystal film. Also, as described below, a piezoelectric thin film 3 such as $LiNbO_3$, $LiTaO_3$ or the like (see FIG. 2) may be epitaxially grown on ZnO. In other words, the buffer layer 2 functions as a buffer layer for excellently epitaxially growing the piezoelectric thin film 3 that is formed on the buffer layer 2.

Also, ZnO can be readily dissolved in an acid, such as, a diluted hydrochloric acid (in a concentration of about 10%, for example), a phosphoric acid or the like, or an alkali such as KOH or the like. By this, the buffer layer 2 can also excellently function as a sacrificial layer, as described below.

Figure 2:
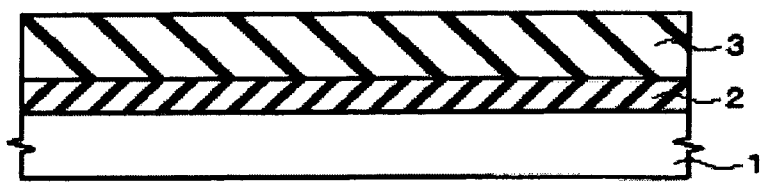
FIG. 2 is a cross-sectional view schematically showing the method for manufacturing a piezoelectric thin film resonator in accordance with the embodiment.

(2) Next, as shown in FIG. 2, a piezoelectric thin film 3 is formed on the buffer layer 2. For example, $LiNbO_3$, $LiTaO_3$ or the like can be used as the piezoelectric thin film 3. The method for forming the piezoelectric thin film 3 is not particularly limited, and a known film forming method, such as, for example, a sputter method, a vapor deposition method, a sol-gel method or the like can be used. In the present embodiment, a laser ablation method is used. Concrete film forming conditions are as follows.

The film-forming temperature (substrate temperature) is, for example, 400° C. or higher. The degree of vacuum during the film-formation is, for example, 1.33 Pa ($1\times10^{-2}$ Torr) or less. By forming the piezoelectric thin film 3 under such conditions, for example, the piezoelectric thin film 3 can be epitaxially grown on the buffer layer 2. More concretely, for example, $LiNbO_3$ or $LiTaO_3$ can be epitaxially grown with a (0001) orientation on, for example, ZnO. It is noted that the film forming conditions are not limited to the conditions described above.

It is noted that the first substrate 1, the buffer layer 2 and the piezoelectric thin film 3 are not limited to the materials described above. For example, a Si substrate or a $SrTiO_3$ substrate may be used as the first substrate 1, a metal oxide MO (M=Mg, Ca, Sr, Ba) with a NaCl structure, such as SrO, MgO or the like may be used as the buffer layer 2, and $KNbO_3$ may be used as the piezoelectric thin film 3. The metal oxide MO functions as a buffer layer for epitaxially growing the piezoelectric thin film 3 thereon, and also functions as a sacrificial layer as described below. Also, the piezoelectric thin film 3 can be composed of a compound including at least one of $KNbO_3$, $LiNbO_3$ and $LiTaO_3$ as a main component.

Figure 3:
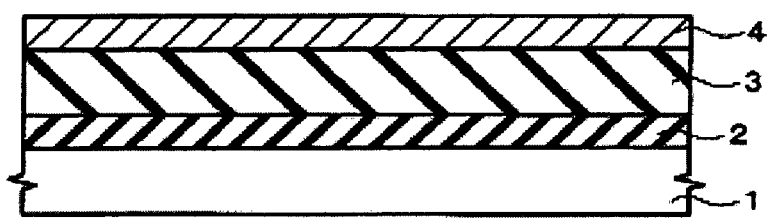
FIG. 3 is a cross-sectional view schematically showing the method for manufacturing a piezoelectric thin film resonator in accordance with the embodiment.

(3) Next, as shown in FIG. 3, a first electrode 4 is formed on the piezoelectric thin film 3. For example, Al, Pt, Ir, Au, Ag or Cu may be used as the first electrode 4. In the present embodiment, Al is used as the first electrode 4. The first electrode 4 can be formed by, for example, a sputter method.

Figure 4:
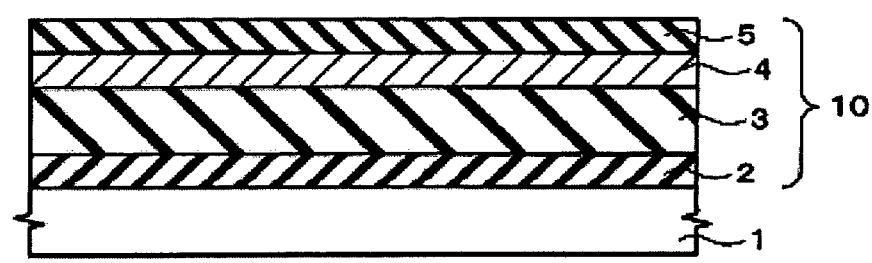
FIG. 4 is a cross-sectional view schematically showing the method for manufacturing a piezoelectric thin film resonator in accordance with the embodiment.

(4) Next, as shown in FIG. 4, a protection layer 5 may be formed on the first electrode 4. A dielectric film, such as, for example, $SiO_2$, $ZrO_2$, $Al_2O_3$ or $Ta_2O_5$ can be used as the protection layer 5. It is noted that the protection layer 5 may not be formed.

By the steps described above, a laminated body 10 can be formed on the first substrate, as shown in FIG. 4.

Figure 5:
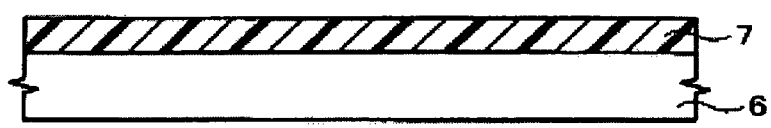
FIG. 5 is a cross-sectional view schematically showing the method for manufacturing a piezoelectric thin film resonator in accordance with the embodiment.

(5) Next, as shown in FIG. 5, a second substrate 6 is prepared. Next, an adhesion layer 7 is formed on the second substrate 6. The second substrate 6 is provided for mounting the piezoelectric thin film 3, the first electrode 4 and the protection layer 5. As the second substrate 6 in accordance with the present embodiment, a silicon substrate with semiconductor elements formed in advance thereon is used. In other words, as the second substrate 6, a silicon substrate in which semiconductor elements (not shown) are formed in a surface layer section of the second substrate 6, and an amorphous $SiO_2$ film (not shown) is formed over the semiconductor elements is used. It is noted that the second substrate 6 is not limited to the above, and an arbitrary substrate in a variety of types, such as, for example, a glass substrate, a metal substrate, a plastic substrate, a flexible substrate and the like can be used according to the purpose or usage.

As the adhesion layer 7, a heat-setting type adhesive, a UV-setting type adhesive, a light-setting type adhesive or a reactive setting type adhesive may be used. The adhesion layer 7 can be formed by, for example, a coating method or the like. It is noted that, in the example described above, the adhesion layer 7 is described as being formed on the second substrate 6. However, the adhesion layer 7 can be formed on an upper surface of the first electrode 4 when the protection layer 5 is not formed, or on an upper surface of the protection layer 5 when the protection layer 5 is formed.

Figure 6:
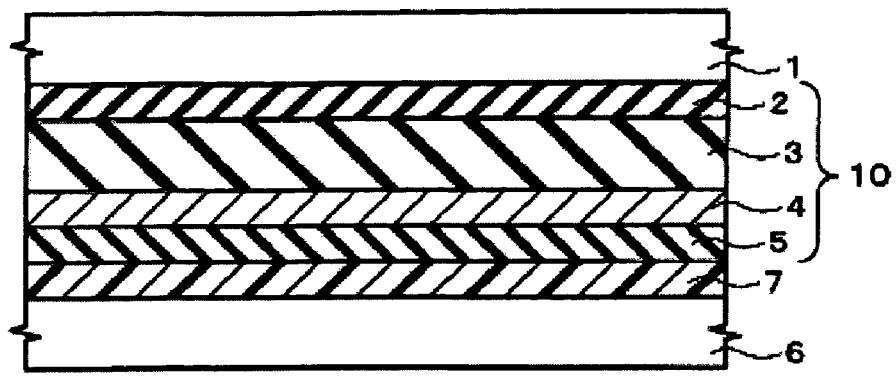
FIG. 6 is a cross-sectional view schematically showing the method for manufacturing a piezoelectric thin film resonator in accordance with the embodiment.

(6) Next, as shown in FIG. 6, the laminated body 10 is aligned to a desired position on the second substrate 6, and pressure-bonded to bond the second substrate 6 and the laminated body 10. The second substrate 6 and the laminated body 10 are bonded such that the first substrate 1 is positioned above the second substrate 6. Concretely, in accordance with the present embodiment, the protection layer 5 is bonded with the adhesion layer 7.

Figure 7:
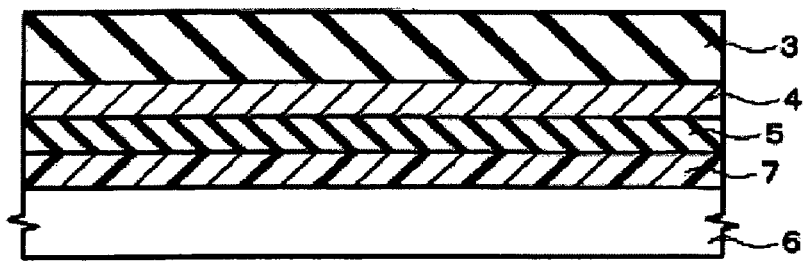
FIG. 7 is a cross-sectional view schematically showing the method for manufacturing a piezoelectric thin film resonator in accordance with the embodiment.

(7) Next, as shown in FIG. 7, the first substrate 1 is separated from the laminated body 10. Concretely, for example, the buffer layer 2 composed of ZnO is wet-etched, to dissolve and remove the buffer layer 2. As a result, the first substrate 1 composed of a single crystal sapphire can be separated from the laminated body 10. In other words, as shown in FIG. 7, the adhesion layer 7, the protection layer 5, the first electrode 4, and the piezoelectric thin film 3 remain on the second substrate 6. In this step, the buffer layer 2 functions as a sacrificial layer that is dissolved and removed.

For example, diluted nitric acid may be used as the etching liquid, but another acid or an alkali solution such as KOH can also be used without being limited to the above. When SrO or MgO with a NaCl structure described above is used as the buffer layer 2, the first substrate 1 can be easily separated from the laminated body 10 because the etching rate of these materials against an acid is very high. Accordingly, acid to be used as the etching solution may preferably have a low concentration in order to protect the piezoelectric thin film 3.

Figure 8:
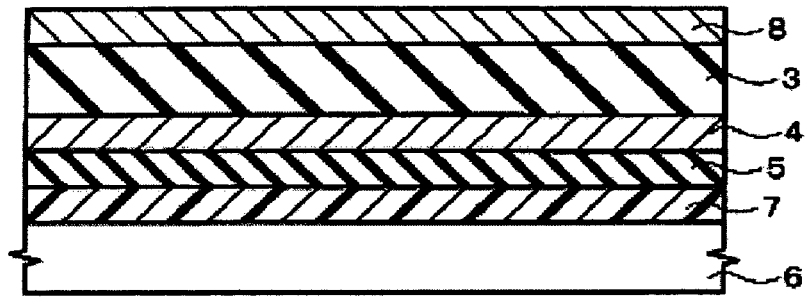
FIG. 8 is a cross-sectional view schematically showing the method for manufacturing a piezoelectric thin film resonator in accordance with the embodiment.

(8) Next, as shown in FIG. 8, a second electrode 8 is formed on the piezoelectric thin film 3. By this, a structure in which the piezoelectric thin film 3 is sandwiched between the first electrode 4 and the second electrode 8 is formed. For example, Al, Pt, Ir, Au, Ag, Cu or the like can be used as the second electrode 8. The material of the second electrode 8 may preferably be the same as that of the first electrode 4 in view of its interface state with the piezoelectric thin film 3.

Figure 9:
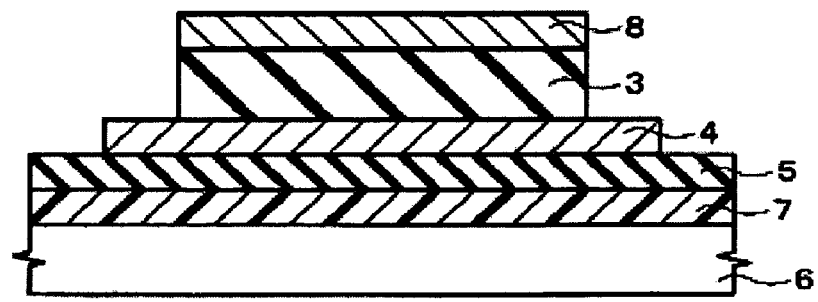
FIG. 9 is a cross-sectional view schematically showing the method for manufacturing a piezoelectric thin film resonator in accordance with the embodiment.

(9) Next, as shown in FIG. 9, the second electrode 8, the piezoelectric thin film 3 and the first electrode 4 are successively patterned from the top. Patterning can be conducted by using a known lithography technique and dry-etching. Then, wirings (not shown) for electrically connecting the second electrode 8 and the semiconductor element (not shown) previously formed on the second substrate 6 may be formed. Concretely, the first electrode 4 and a part of the piezoelectric thin film 3 are protected by a dielectric film, a metal film for wiring is formed thereon, and the metal film is patterned, whereby the wirings can be formed.

Figure 10:
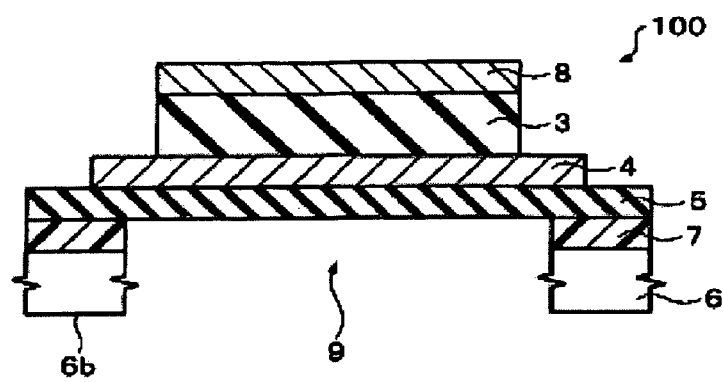
FIG. 10 is a cross-sectional view schematically showing the method for manufacturing a piezoelectric thin film resonator in accordance with the embodiment.

(10) Next, as shown in FIG. 10, the second substrate 6 and the adhesion layer 7 are patterned. Concretely, first, for example, a resist layer (not shown) is formed on a back surface 6b of the second substrate 6 by using a known lithography technique in areas other than a region where an opening section 9 (see FIG. 10) is formed. By using the resist layer as a mask, a silicon region among the second substrate 6 is etched by, for example, a wet-etching method. For example, KOH or the like may be used as the etching liquid. Next, a $SiO_2$ region among the second substrate 6 and the adhesion layer 7 are etched by, for example, a dry-etching method. By this, the opening section 9 is formed. Next, the resist layer is removed.

The adhesion layer 7 may have a thickness of, for example, about several μm, and may have differences in the thickness. In this respect, etching may be conducted to penetrate the adhesion layer 7 until the protection layer 5 is exposed, whereby influences on the device characteristics that may be caused by differences in the thickness of the adhesion layer 7 can be suppressed. In this case, because the protection layer 5 is formed, the protection layer 5 acts as a supporting layer and improves the mechanical strength. Also, the protection layer 5 can function as an etching stopper layer.

It is noted that, in this patterning step, at least the piezoelectric thin film 3 may preferably be covered in advance by a resist in order to protect the piezoelectric thin film 3 when etching is conducted.

Next, the semiconductor element (not shown) formed in advance on the second substrate 6 is electrically connected to the first electrode 4.

By the steps described above, the piezoelectric thin film resonator 100 in accordance with the present embodiment can be manufactured.

It is noted that, after the laminated body 10 is formed (see FIG. 4), grooves with a depth that reaches at least the buffer layer 2 may be formed. These grooves may penetrate the protection layer 5, the first electrode 4, and the piezoelectric thin film 3. Consequently, when the buffer layer 2 is wet-etched, the etching liquid can run through the grooves and readily enter the center portion of the buffer layer 2, such that the entire buffer layer 2 can be etched much quicker.

Also, the method for manufacturing a piezoelectric thin film resonator in accordance with the present invention can also be applied to the manufacture of piezoelectric elements. Concretely, the method can be applied, for example, to an ink jet head using a piezoelectric thin film, and further to an ink jet printer using the same. Also, in the example described above, the piezoelectric thin film resonator 100 in a diaphragm type is shown, but the method can also be applied to SMR (Solidly Mounted Resonator) type piezoelectric thin film resonators.

The piezoelectric thin film resonator 100 (see FIG. 10) obtained by the method for manufacturing the piezoelectric thin film resonator 100 in accordance with the present embodiment can function as a resonator or a frequency filter.

When an electric field is applied between the first electrode 4 and the second electrode 8 in the piezoelectric thin film resonator 100 in accordance with the present embodiment, acoustic waves in thickness longitudinal vibration are excited in the thickness direction of the piezoelectric thin film 3. The resonance frequency depends on the material used and the film thickness. When the same material is used, the smaller the film thickness of the piezoelectric thin film 3, the higher the resonance frequency becomes, which is advantageous in achieving higher frequencies. By controlling the film thickness, resonance of a specific frequency or a specific band frequency can be obtained (i.e., can be filtered).

1-2. Action and Effect

According to the method for manufacturing the piezoelectric thin film resonator 100 in accordance with the present embodiment, the buffer layer 2, the piezoelectric thin film 3, the first electrode 4, and the protection layer 5 are successively laminated on the first substrate 1, to thereby form the laminated body 10. Then, the second substrate 6 and the laminated body 10 are bonded to each other, and then the first substrate 1 is separated from the laminated body 10. For example, as described above, as the second substrate 6, a silicon substrate in which semiconductor elements are formed in its surface layer section and an amorphous $SiO_2$ layer that functions as a protection layer or an interlayer dielectric layer is formed over the semiconductor elements can be used. Ordinarily, it is difficult to epitaxially grow the piezoelectric thin film 3 composed of $LiNbO_3$ or $LiTaO_3$ directly on a silicon substrate or $SiO_2$. Further, when the piezoelectric thin film 3 is formed directly on the second substrate 6, Li that is an alkali metal may diffuse in the semiconductor elements because the film forming temperature is high (for example, 400° C. or higher), and may affect the characteristics of the semiconductor elements.

According to the method for manufacturing the piezoelectric thin film resonator 100 in accordance with the present embodiment, the piezoelectric thin film 3 can be formed above the first substrate 1 through the buffer layer 2, such that the piezoelectric thin film 3 composed of a high quality epitaxial film can be readily formed. Then, according to this manufacturing method, even when semiconductor elements are formed in advance on the second substrate 6, the semiconductor elements would not be affected by the film-forming temperature of the piezoelectric thin film 3. Accordingly, the piezoelectric thin film resonator 100 having the piezoelectric thin film 3 with excellent crystallinity and the semiconductor elements with excellent characteristics can be readily integrated.

More concretely, according to the manufacturing method, the piezoelectric thin film 3 with excellent crystallinity can be readily formed by using a material such as $LiNbO_3$, $LiTaO_3$ or $KNbO_3$ having an electromechanical coupling coefficient greater than that of ZnO or AlN. Also, according to the manufacturing method, even when the piezoelectric thin film 3 is formed by using a material such as $LiNbO_3$, $LiTaO_3$ or $KNbO_3$ which does not contain Pb that is a harmful substance, compared to Pb (Zr, Ti) $O_3$ or $PbTiO_3$, the characteristics of the semiconductor elements formed on the second substrate 6 are not affected. Accordingly, the piezoelectric thin film resonator 100 having the piezoelectric thin film 3 with excellent crystallinity and the semiconductor elements with excellent characteristics can be readily integrated. Also, Pb-free devices which are preferable from the viewpoint of environments can be provided.

Also, according to the method for manufacturing the piezoelectric thin film resonator 100 in accordance with the present embodiment, the first substrate 1 that is separated from the laminated body 10 can be re-used for forming a piezoelectric thin film 3 again. Also, because the buffer layer 2 and the piezoelectric thin film 3 can be formed on a desired first substrate 1, a first substrate 1 that makes the crystallinity of the buffer layer 2 and the piezoelectric thin film 3 excellent can be selected. Accordingly, by this manufacturing method, the manufacturing cost can be reduced, and the piezoelectric thin film resonator 100 having the piezoelectric thin film 3 with excellent crystallinity can be obtained.

2-1. Oscillator

Figure 11:
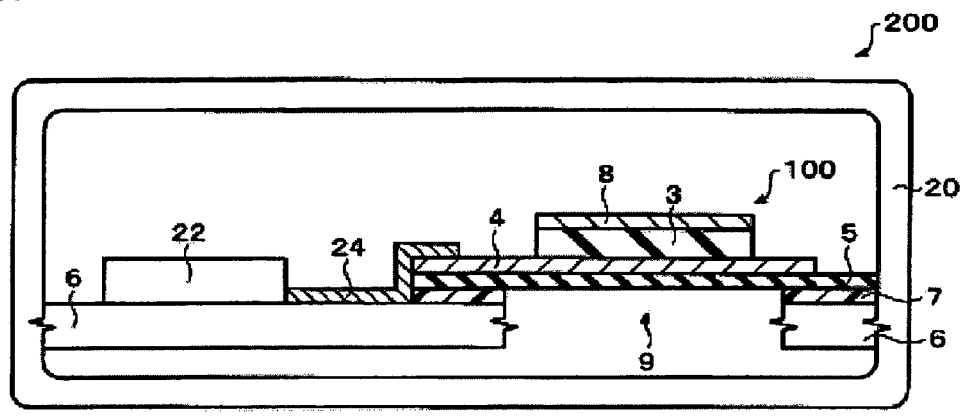
FIG. 11 is a cross-sectional view schematically showing an oscillator in accordance with an embodiment.

Next, an example of an oscillator 200 in accordance with an embodiment of the present invention is described. FIG. 11 is a side see-through view of the oscillator 200 in accordance with the present embodiment. It is noted that constituting elements having substantially the same functions as those of the piezoelectric thin film resonator 100 described above are appended with the same reference numerals, and their detailed description is omitted.

The oscillator 200 includes a metal housing 20, a piezoelectric thin film resonator 100 and an oscillator circuit 22. A second substrate 6 with the piezoelectric thin film resonator 100 and the oscillation circuit 22 being formed thereon is mounted inside the housing 20. The oscillation circuit 22 controls the frequency to be applied to the piezoelectric thin film resonator 100 according to a voltage value that is inputted from an external circuit (not shown).

As shown in FIG. 11, in the oscillator 200, the oscillation circuit 22 and the piezoelectric thin film resonator 100 are formed in a manner to share the second substrate 6. The oscillation circuit 22 and a first electrode 4 of the piezoelectric thin film resonator 100 are electrically connected to each other by a wiring 24. It is noted that the oscillation circuit 22 and a second electrode 8 of the piezoelectric thin film resonator 100 are electrically connected to each other, although not shown. In the present embodiment, TFTs (Thin Film Transistors) are used as transistors composing the oscillation circuit 22.

2-2. Method for Manufacturing Oscillator

An example of a method for manufacturing an oscillator 200 in accordance with an embodiment of the present invention is described with reference to FIG. 1-FIG. 4 and FIG. 11-FIG. 17. FIG. 1-FIG. 4 and FIG. 11-FIG. 17 are cross-sectional views schematically showing a process for manufacturing the oscillator 200.

(1) First, as shown in FIG. 1-FIG. 4, a laminated body 10 is formed on a first substrate 1. The method for forming the laminated body 10 is similar to the method for manufacturing the piezoelectric thin film resonator 100 described above, and therefore its detailed description is omitted.

Figure 12:
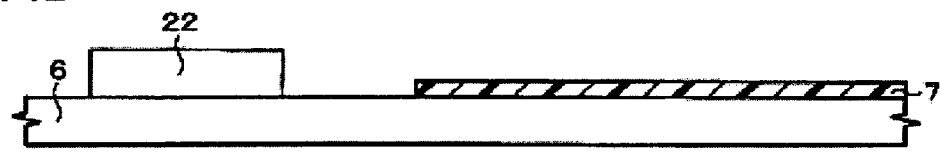
FIG. 12 is a cross-sectional view schematically showing a method for manufacturing an oscillator in accordance with an embodiment.

(2) Next, as shown in FIG. 12, an oscillation circuit 22 is formed on a second substrate 6. As transistors composing the oscillation circuit 22, for example, TFTs can be used. As the second substrate 6, for example, a silicon substrate can be used. It is noted that the second substrate 6 is not limited to the above, but an arbitrary substrate in a variety of types, such as, for example, a glass substrate, a metal substrate, a plastic substrate, a flexible substrate and the like can be used according to the purpose or usage.

Next, an adhesion layer 7 is formed on the second substrate 6. The method for forming the adhesion layer 7 is similar to the method for manufacturing the piezoelectric thin film resonator 100 described above, and therefore its detailed description is omitted.

Figure 13:
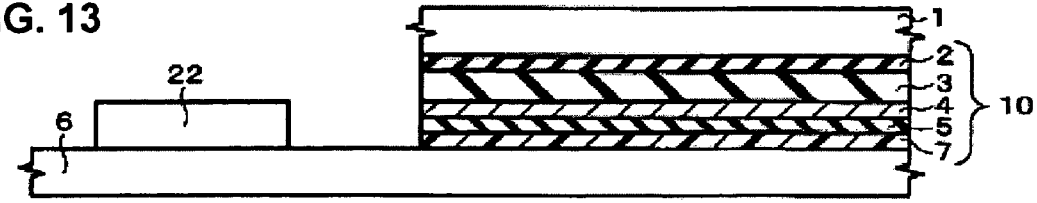
FIG. 13 is a cross-sectional view schematically showing the method for manufacturing an oscillator in accordance with the embodiment.

(3) Next, as shown in FIG. 13, the laminated body 10 is aligned to a region on the second substrate 6 other than the region where the oscillation circuit 22 is formed, and crimped to bond the second substrate 6 and the laminated body 10. The second substrate 6 and the laminated body 10 are bonded such that the first substrate 1 is positioned above the second substrate 6. Concretely, in accordance with the present embodiment, the protection layer 5 is bonded with the adhesion layer 7.

Figure 14:
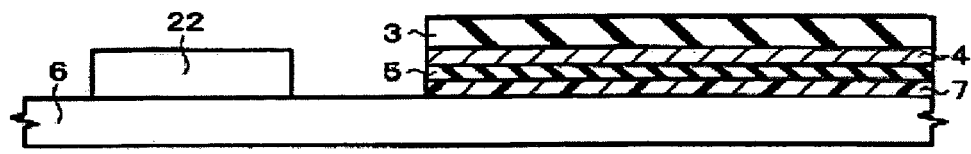
FIG. 14 is a cross-sectional view schematically showing the method for manufacturing an oscillator in accordance with the embodiment.

(4) Next, as shown in FIG. 14, the first substrate 1 is separated from the laminated body 10. The method for separating the first substrate 1 is similar to the method for manufacturing the piezoelectric thin film resonator 100 described above, and therefore its detailed description is omitted. It is noted that, before the step of separating the first substrate 1 from the laminated body 10, the oscillation circuit 22 may preferably be covered by a resist so as to be protected.

Figure 15:
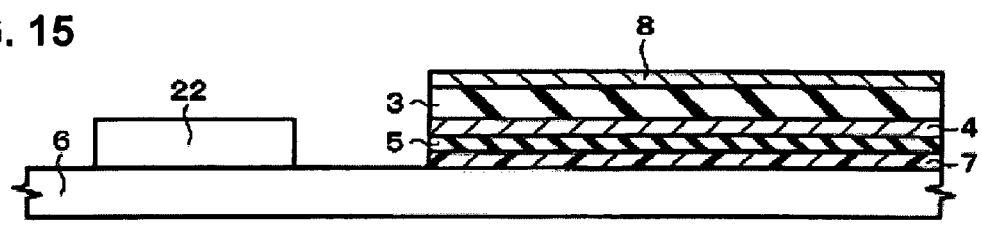
FIG. 15 is a cross-sectional view schematically showing the method for manufacturing an oscillator in accordance with the embodiment.

(5) Next, as shown in FIG. 15, a second electrode 8 is formed on the piezoelectric thin film 3. By this, a structure in which the piezoelectric thin film 3 is sandwiched between the first electrode 4 and the second electrode 8 is formed. The method for forming the second electrode 8 is similar to the method for manufacturing the piezoelectric thin film resonator 100 described above, and therefore its detailed description is omitted.

Figure 16:
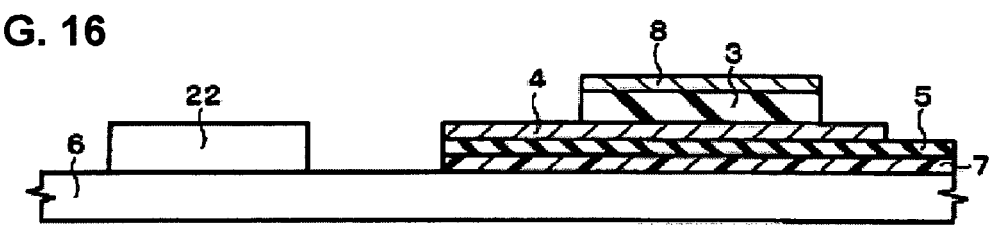
FIG. 16 is a cross-sectional view schematically showing the method for manufacturing an oscillator in accordance with the embodiment.

(6) Next, as shown in FIG. 16, the second electrode 8, the piezoelectric thin film 3 and the first electrode 4 are successively patterned from the top. Patterning can be conducted by using a known lithography technique and dry-etching. Then, a wiring (not shown) for electrically connecting the second electrode 8 and the oscillation circuit 22 may be formed. Concretely, the first electrode 4 and a part of the piezoelectric thin film 3 are protected by a dielectric film, a metal film for wiring is formed thereon, and the metal film is patterned, whereby the wirings can be formed.

Figure 17:
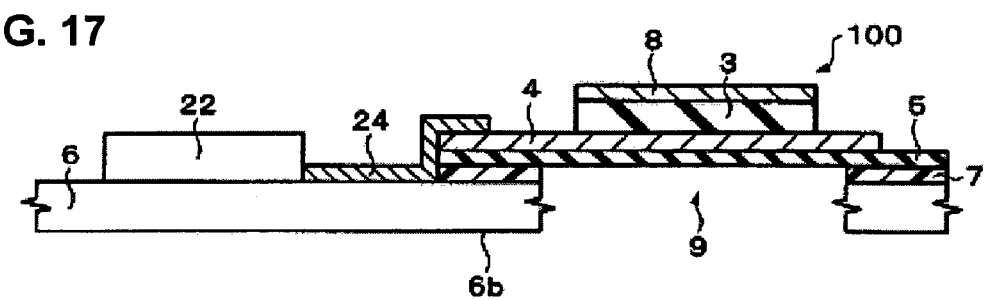
FIG. 17 is a cross-sectional view schematically showing the method for manufacturing an oscillator in accordance with the embodiment.

(7) Next, as shown in FIG. 17, the second substrate 6 and the adhesion layer 7 are patterned. The patterning method is similar to the method for manufacturing the piezoelectric thin film resonator 100 described above, and therefore its detailed description is omitted.

Next, a wiring 24 that electrically connects the first electrode 4 and the oscillation circuit 22 is formed. The wiring 24 can be formed by using, for example, a known lift-off method.

Next, as shown in FIG. 11, the second substrate 6 with the piezoelectric thin film resonator 100 and the oscillation circuit 22 formed thereon is mounted in the metal (Al or stainless steel) housing 20.

By the steps described above, the oscillator 200 in accordance with the present embodiment can be manufactured. It is noted that, in the example described above, an example in which the step for forming the oscillation circuit 22 is conducted before the step of bonding the second substrate 6 and the laminated body 10 is described. However, the step of forming the oscillation circuit 22 can be conducted after the step of bonding the second substrate 6 and the laminated body 10.

2-3. Action and Effect

According to the method for manufacturing the oscillator 200 in accordance with the present embodiment, the buffer layer 2, the piezoelectric thin film 3, the first electrode 4, and the protection layer 5 are successively laminated on the first substrate 1, to thereby form the laminated body 10. Then, the second substrate 6 and the laminated body 10 are bonded, and then the first substrate 1 is separated from the laminated body 10. According to this manufacturing method, before the second substrate 6 and the laminated body 10 are bonded, the oscillation circuit 22 is formed on the second substrate 6. Then, as the second substrate 6, for example, a silicon substrate or the like can be used. Accordingly, after the oscillation circuit 22 is formed, an exposed surface portion of the second substrate 6 is composed of, for example, silicon or $SiO_2$. Ordinarily, it is difficult to epitaxially grow the piezoelectric thin film 3 composed of $LiNbO_3$ or $LiTaO_3$ directly on a silicon substrate or $SiO_2$. Further, when the piezoelectric thin film 3 is formed directly on the second substrate 6, Li that is an alkali metal may diffuse in the oscillation circuit 22 because the film forming temperature is high (for example, 400° C. or higher), and may affect the characteristics of the oscillation circuit 22.

According to the method for manufacturing the oscillator 200 in accordance with the present embodiment, the piezoelectric thin film 3 can be formed above the first substrate 1 through the buffer layer 2, such that the piezoelectric thin film 3 composed of a high quality epitaxial film can be readily formed. Then, according to this manufacturing method, before the second substrate 6 and the laminated body 10 are bonded, the oscillation circuit 22 is formed on the second substrate 6, such that the oscillation circuit 22 would not be affected by the film-forming temperature of the piezoelectric thin film 3. Accordingly, the piezoelectric thin film resonator 100 having the piezoelectric thin film 3 with excellent crystallinity and the oscillation circuit 22 with excellent characteristics can be readily integrated. As a result, the oscillator 200 with excellent characteristics can be obtained.

More concretely, according to the manufacturing method, the piezoelectric thin film 3 with excellent crystallinity can be formed by using a material such as $LiNbO_3$, $LiTaO_3$ or $KNbO_3$ having an electromechanical coupling coefficient greater than that of ZnO or AlN. Also, according to the manufacturing method, even when the piezoelectric thin film 3 is formed by using a material such as $LiNbO_3$, $LiTaO_3$ or $KNbO_3$ which does not contain Pb that is a harmful substance, compared to Pb (Zr, Ti) $O_3$ or $PbTiO_3$, the characteristics of the oscillation circuit 22 formed on the second substrate 6 are not affected. Accordingly, the piezoelectric thin film resonator 100 having the piezoelectric thin film 3 with excellent crystallinity and the oscillation circuit 22 with excellent characteristics can be readily integrated. Also, Pb-free devices which are preferable from the viewpoint of environments can be provided.

Also, according to the method for manufacturing the oscillator 200 in accordance with the present embodiment, the first substrate 1 that is separated from the laminated body 10 can be re-used for forming a piezoelectric thin film 3 again. Also, because the buffer layer 2 and the piezoelectric thin film 3 can be formed on a desired first substrate 1, a first substrate 1 that makes the crystallinity of the buffer layer 2 and the piezoelectric thin film 3 excellent can be selected. Accordingly, by this manufacturing method, the manufacturing cost can be reduced, and the oscillator 200 having the piezoelectric thin film 3 with excellent crystallinity can be obtained.

3. Electronic Circuit and Electronic Apparatus

Next, an electronic circuit and an electronic apparatus in accordance with the present embodiments are described with reference to the drawings.

Figure 18:
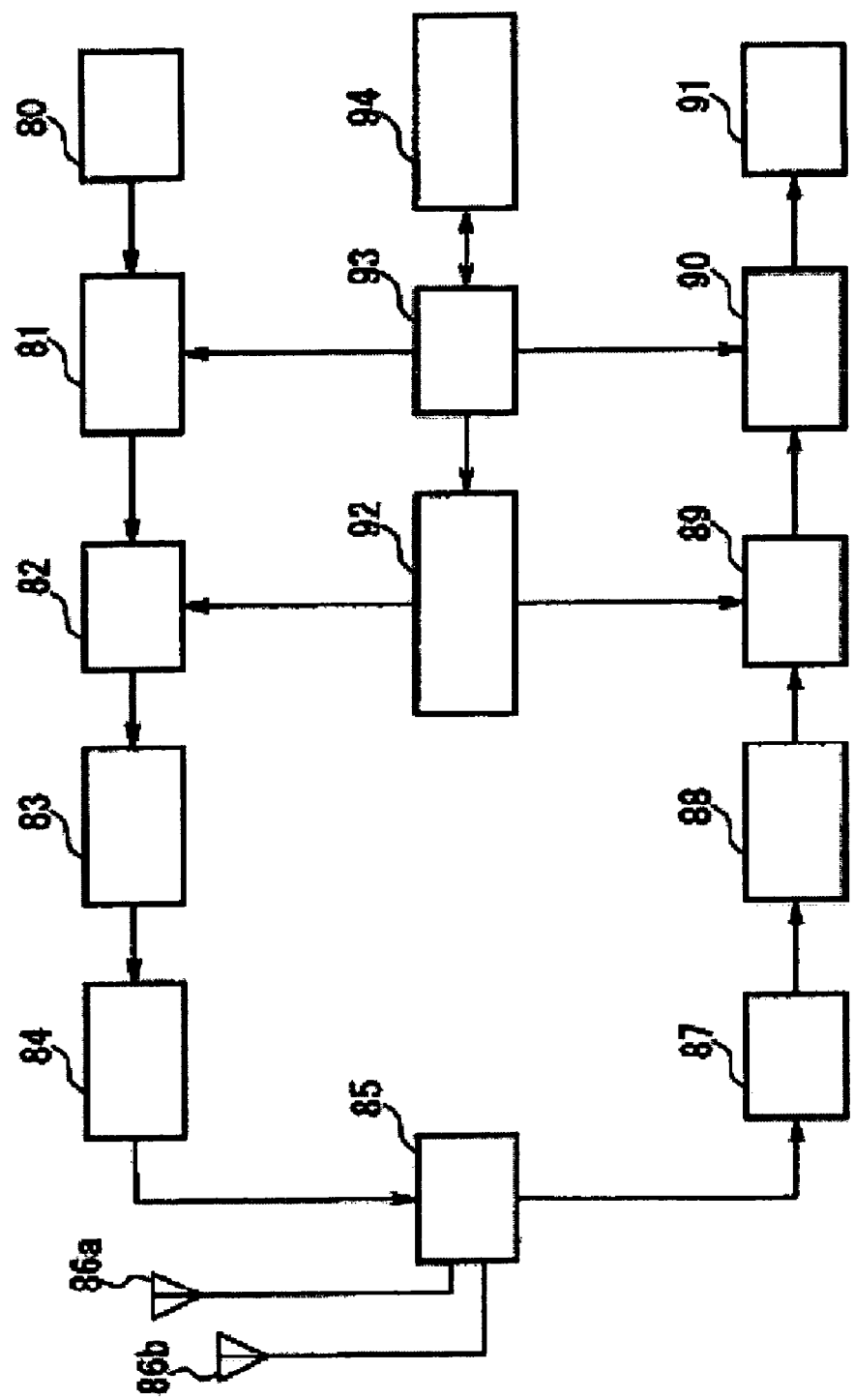
FIG. 18 is a block diagram showing the structure of an electronic circuit in accordance with an embodiment.

FIG. 18 is a block diagram showing an electrical structure of an electronic circuit in accordance with an embodiment of the present invention. It is noted that the electronic circuit indicated in FIG. 18 is a circuit that is provided, for example, inside a cellular phone 300 shown in FIG. 19. The cellular phone 300 is an example of an electronic apparatus in accordance with the present invention. The cellular phone 300 is composed of an antenna 301, a receiver 302, a transmitter 303, a liquid crystal display 304, operating buttons 305, and the like.

The electronic circuit shown in FIG. 18 has the basic structure of an electronic circuit provided inside the cellular phone 300. The electronic circuit shown in FIG. 18 is equipped with a transmitter 80, a transmission signal processing circuit 81, a transmission mixer 82, a transmission filter 83, a transmission power amplifier 84, a transceiver wave divider 85, antennas 86a, 86b, a low noise amplifier 87, a reception filter 88, a reception mixer 89, a reception signal processing circuit 90, a receiver 91, a frequency synthesizer 92, a control circuit 93, and an input/display circuit 94.

In the electronic circuit shown in FIG. 18, the frequency filters, shown in FIG. 10, can be used as the transmission filter 83 and the reception filter 88. Frequencies to be filtered (frequencies to be passed) are set individually for the transmission filter 83 and the reception filter 88 according to a frequency that is necessary among signals outputted from the transmission mixer 82 and a frequency that is necessary among signals outputted from the low noise amplifier 87, respectively. Also, the frequency synthesizer 92 may include an oscillator 200 shown in FIG. 11.

Figure 19:
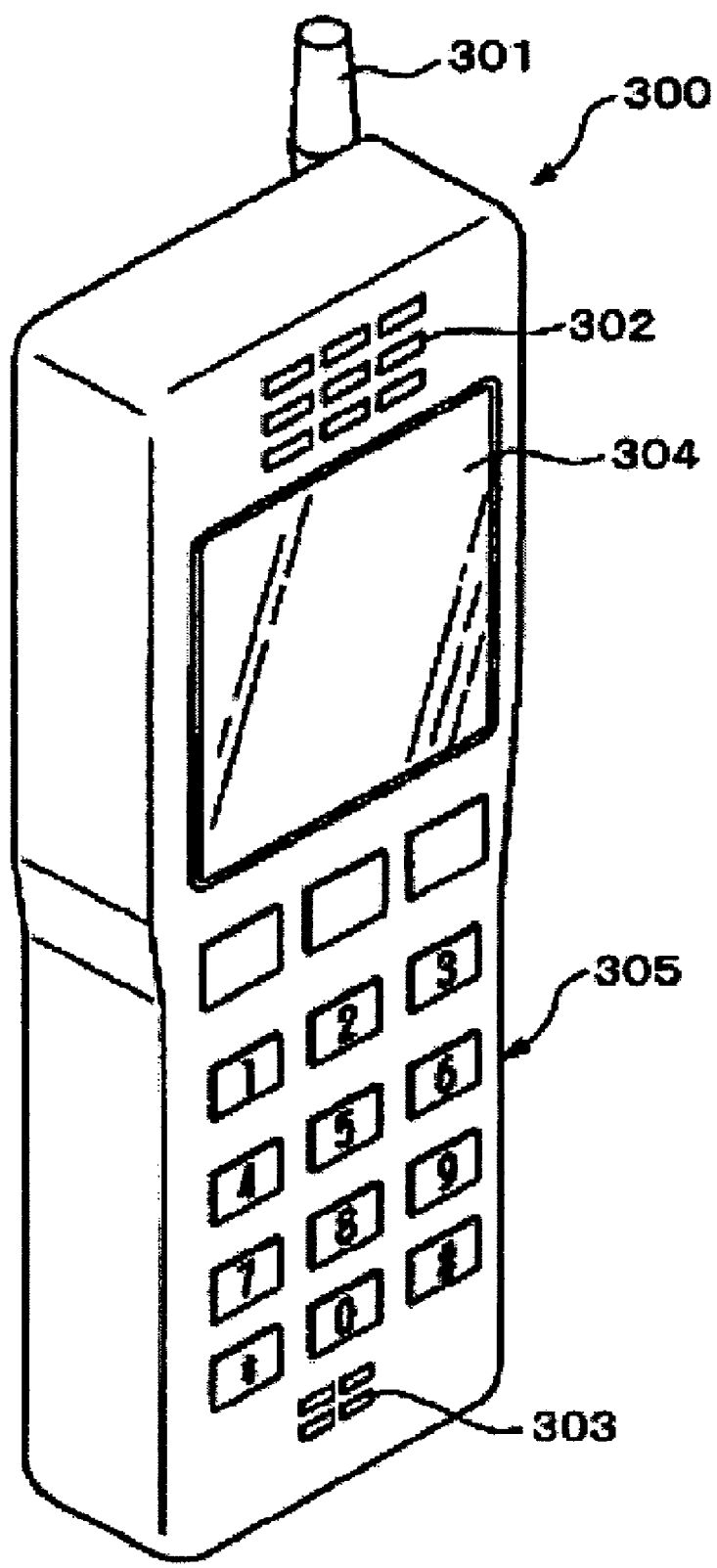
FIG. 19 is a perspective view showing a cellular phone as an electronic device in accordance with an embodiment.

The transmitter 80 can be realized with a microphone which converts sound wave signals into electric signals, for example, and may correspond to the transmitter 303 in the cellular phone 300 shown in FIG. 19. The transmission signal processing circuit 81 is a circuit for performing such processing as D/A conversion, modulation, etc. on the electric signal to be outputted from the transmitter 80. The transmission mixer 82 mixes the signal outputted from the transmission signal processing circuit 81 using the signal outputted from the frequency synthesizer 92. The transmission filter 83 permits passage of only those signals of the required frequency from among the intermediate frequencies (hereafter referred to as "IF"), and cuts unnecessary frequency signals. The signal outputted from the transmission filter 83 is converted to an RF signal by a converting circuit (not shown). The transmission power amplifier 84 amplifies the power of the RF signal outputted from the transmission filter 83 and outputs this amplified result to the transceiver wave divider 85.

The transceiver wave divider 85 outputs the RF signal outputted from the transmission power amplifier 84 to the antennas 86a and 86b, and transmits the signal in the form of radio waves from the antennas 86a and 86b. Also, the transceiver wave divider 85 divides the reception signal received by the antennas 86a and 86b, and outputs the result to the low noise amplifier 87. The low noise amplifier 87 amplifies the reception signal from the transceiver wave divider 85. The signal outputted from the low noise amplifier 87 is converted to IF by a converting circuit (not shown).

The reception filter 88 permits passage of only those signals of the required frequency from among the intermediate frequencies (IF) that were converted by a converting circuit (not shown), and cuts unnecessary frequency signals. The reception mixer 89 employs the signal outputted from the frequency synthesizer 92 to mix the signals outputted from the reception filter 88. The reception signal processing circuit 90 performs such processing as A/D conversion, modulation, etc., to the signal outputted from the reception mixer 89. The receiver 91 is realized by means of a small speaker which converts electric signals into sound waves, for example, and corresponds to the receiver 302 in the cellular phone 300 shown in FIG. 19.

The frequency synthesizer 92 is a circuit for generating the signal to be supplied to the transmission mixer 82 and the signal to be supplied to the reception mixer 89. The control circuit 93 controls the transmission signal processing circuit 81, the reception signal processing circuit 90, the frequency synthesizer 92, and the input/display circuit 94, thereby controlling the overall operation of the cellular phone. The input/display circuit 94 displays the device status to the user of the cellular phone 300 shown in FIG. 19, and is provided for the user to input directions. This input/display circuit 94 corresponds, for example, to the liquid crystal display 304 and the operating buttons 305 on the cellular phone 300.

The piezoelectric thin film resonator and its manufacturing method, the frequency filter, the oscillator and its manufacturing method, the electronic circuit, and the electronic apparatus in accordance with the embodiments of the present invention are explained above. However, the present invention is not limited to the above-described embodiments, but rather a variety of modifications may be freely made within the scope of the invention.

For example, in the above-described embodiments, a cellular phone is enumerated as an example of an electronic apparatus, but they can also be applied to other portable information apparatuses and personal computers. Also, an electronic circuit provided inside the cellular phone is enumerated as an example of an electronic circuit. However, they may be applied to a variety of other mobile communications devices and their internal electronic circuits.

Furthermore, the present invention is not limited to mobile communications devices, but may also be applied to communications devices used in a stationary state such as tuners for receiving BS and CS transmissions, and their internal electronic circuits provided therein. Moreover, the present invention is neither limited to communications devices employing radio waves propagating through air as the communications carrier, but may also be applied to electronic devices and their internal electronic circuitry, such as HUB, which employ high-frequency signals propagating through a co-axial cable or optical signals propagating through an optical cable.

What is claimed is:

1. A method for manufacturing a piezoelectric thin film resonator, comprising:
    forming a buffer layer including MgO or SrO, above a single-crystal sapphire substrate;
    forming a piezoelectric thin film above the buffer layer;
    forming a first electrode above the piezoelectric thin film;
    forming a protection layer above the first electrode;
    preparing a silicon substrate having a silicon oxide layer;
    bonding the silicon substrate to the single-crystal sapphire substrate having the buffer layer, the piezoelectric thin film, the first electrode and the protection layer;
    separating the single-crystal sapphire substrate from the piezoelectric thin film by etching the buffer layer;
    after separating the single-crystal sapphire substrate from the piezoelectric thin film forming a second electrode above the piezoelectric thin film; and
    patterning the second electrode, the piezoelectric thin film and the first electrode.

2. A method for manufacturing a piezoelectric thin film resonator according to claim 1, wherein the piezoelectric thin film consists of a material selected from the group consisting of $KNbO_3$, $LiNbO_3$ and $LiTaO_3$, or a compound having the material selected from the group consisting of $KNbO_3$, $LiNbO_3$ and $LiTaO_3$ as a main component.

* * * * *